US010170174B1

United States Patent
Ito et al.

(10) Patent No.: US 10,170,174 B1
(45) Date of Patent: Jan. 1, 2019

(54) APPARATUS AND METHODS FOR REFRESHING MEMORY

(71) Applicant: Micron Technology, Inc., Boise, ID (US)

(72) Inventors: Yutaka Ito, Taito-ku (JP); Yuan He, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/796,340

(22) Filed: Oct. 27, 2017

(51) Int. Cl.
*G11C 7/10* (2006.01)
*G11C 11/406* (2006.01)
*G11C 11/408* (2006.01)
*G11C 11/4076* (2006.01)
*G11C 7/22* (2006.01)

(52) U.S. Cl.
CPC .... *G11C 11/40622* (2013.01); *G11C 11/4076* (2013.01); *G11C 11/4087* (2013.01); *G11C 7/1051* (2013.01); *G11C 7/1078* (2013.01); *G11C 7/22* (2013.01)

(58) Field of Classification Search
CPC ........ G11C 7/1051; G11C 7/1078; G11C 7/22
USPC ....................... 365/189.05, 185.25
See application file for complete search history.

(56) References Cited

U.S. PATENT DOCUMENTS

| 5,299,159 A * | 3/1994 | Balistreri ............. G11C 7/1075 365/189.04 |
| 5,943,283 A | 8/1999 | Wong et al. |
| 7,830,742 B2 | 11/2010 | Han |
| 8,625,360 B2 | 1/2014 | Iwamoto et al. |
| 8,811,100 B2 | 8/2014 | Ku |

(Continued)

FOREIGN PATENT DOCUMENTS

| JP | 2005-216429 A | 8/2005 |
| JP | 2011-258259 A | 12/2011 |

(Continued)

OTHER PUBLICATIONS

U.S. Appl. No. 15/876,566 entitled 'Apparatuses and Methods for Calculating Row Hammer Refresh Addresses in a Semiconductor Device' filed Jan. 22, 2018.

(Continued)

*Primary Examiner* — Jason Lappas
(74) *Attorney, Agent, or Firm* — Dorsey & Whitney LLP

(57) ABSTRACT

Apparatuses for executing row hammer refresh are described. An example apparatus includes: memory banks, each memory bank of the memory banks includes: a latch that stores a row address; and a time based sampling circuit. The time based sampling circuit includes: a sampling timing generator that provides a timing signal of sampling a row address; and a plurality of bank sampling circuits, wherein each bank sampling circuit of the bank sampling circuits is included in a corresponding memory bank of the memory banks and provides a sampling signal to the latch in the corresponding memory bank responsive to the timing signal of sampling the row address; and an interval measurement circuit that receives an oscillation signal, measures an interval of a row hammer refresh execution based on a cycle of the oscillation signal, and further provides a steal rate timing signal for adjusting a steal rate to the sampling timing generator.

20 Claims, 12 Drawing Sheets

(56) References Cited

U.S. PATENT DOCUMENTS

| | | |
|---|---|---|
| 9,032,141 B2 | 5/2015 | Bains et al. |
| 9,117,544 B2 | 8/2015 | Bains et al. |
| 9,805,783 B2 | 10/2017 | Ito et al. |
| 2004/0130959 A1 | 7/2004 | Kawaguchi |
| 2008/0181048 A1 | 7/2008 | Han |
| 2010/0329069 A1 | 12/2010 | Ito et al. |
| 2011/0310648 A1 | 12/2011 | Iwamoto et al. |
| 2014/0006704 A1 | 1/2014 | Greenfield et al. |
| 2014/0095786 A1 | 4/2014 | Moon et al. |
| 2014/0237307 A1 | 8/2014 | Kobla et al. |
| 2014/0241099 A1 | 8/2014 | Seo et al. |
| 2014/0281206 A1 | 9/2014 | Crawford et al. |
| 2015/0089326 A1 | 3/2015 | Joo et al. |
| 2015/0255140 A1 | 9/2015 | Song |
| 2016/0196863 A1 | 7/2016 | Shin et al. |
| 2017/0287547 A1 | 10/2017 | Ito et al. |

FOREIGN PATENT DOCUMENTS

| | | |
|---|---|---|
| JP | 2013-004158 A | 1/2013 |
| WO | 2017171927 A1 | 10/2017 |

OTHER PUBLICATIONS

U.S. Appl. No. 15/789,897, entitled "Apparatus and Methods for Refreshing Memory", filed Oct. 20, 2017; pp. all.
U.S. Appl. No. 15/715,846, entitled "Semiconductor Device", filed Sep. 26, 2017, pp. all.
Kim, et al., "Flipping Bits in MemoryWithout Accessing Them: An Experimental Study of DRAM Disturbance Errors".
U.S. Appl. No. 16/025,844, titled "Apparatus and Methods for Triggering Row Hammer Address Sampling", filed Jul. 2, 2018.

* cited by examiner

APPARATUS AND METHODS FOR REFRESHING MEMORY

BACKGROUND

High data reliability, high speed of memory access, and reduced chip size are features that are demanded from semiconductor memory.

A dynamic random access memory (DRAM), which is a typical semiconductor memory device, stores information by charges accumulated in cell capacitors, and, therefore, the information is lost unless refresh operations are periodically carried out. Therefore, refresh commands indicating refresh operations are periodically issued from a control device, which controls a DRAM. The refresh commands are issued from the control device at a frequency that all the word lines are certainly refreshed one time in the period of 1 refresh cycle (for example, 64 msec). In addition, the refresh command is periodically stolen as Row-Hammer refresh (Rhr) which maintains data retention of a row-address of a victim caused by Row-Hammer attack.

However, a conventional static Row-Hammer refresh rate control may not prevent bit errors due to Row Hammer effects that may occur at various timings from various causes and dynamic Row Hammer refresh rate control may be desired.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
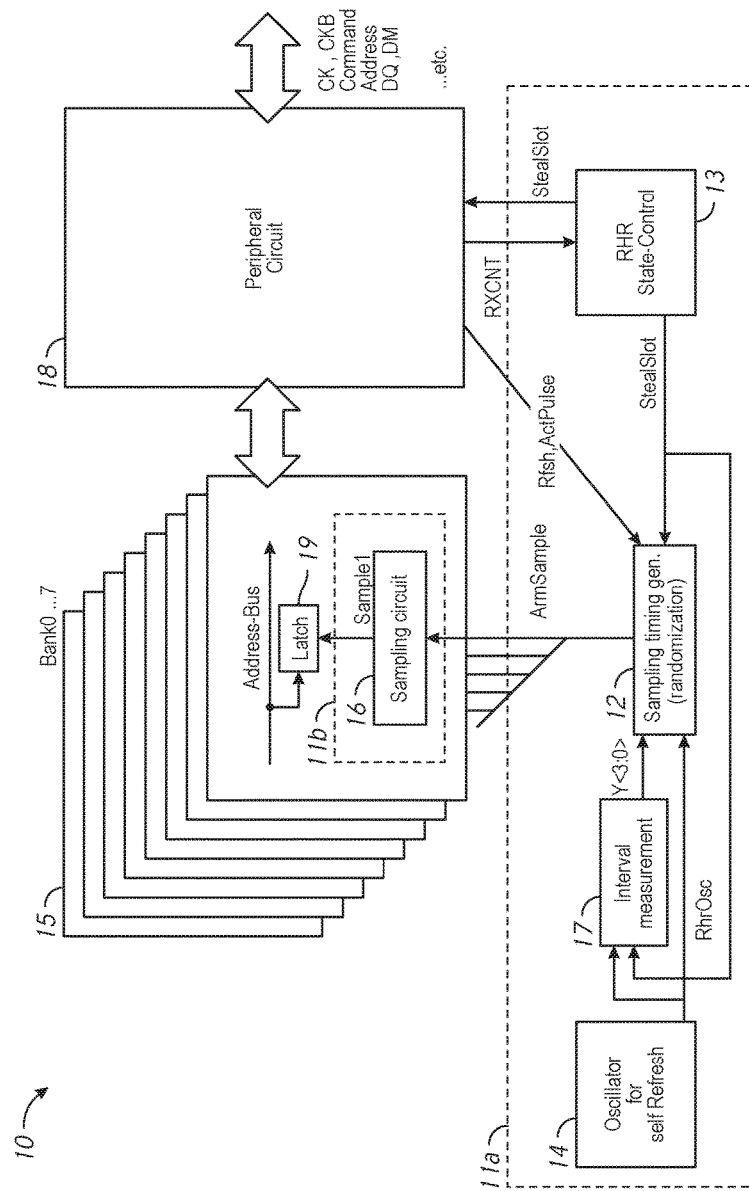
FIG. 1 is a block diagram of a semiconductor device including a sampling circuit and a time based sampling circuit in accordance with an embodiment of the present disclosure.

FIG. 1 is a block diagram of a semiconductor device 10 including a time based sampling circuit 11 in accordance with an embodiment of the present disclosure. The semiconductor device 10 may be an LPDDR4 SDRAM integrated into a single semiconductor chip, for example. The semiconductor device 10 may include a plurality of memory banks 15, a peripheral circuit 18. A time based sampling circuit 11 may include a time based common sampling circuit 11a shared by the plurality of memory banks 15 banks and a bank sampling circuit 11b including a sampling circuit 16 per bank provided in each bank of the plurality of memory banks 15. For example, the peripheral circuit 18 may be a DRAM interface that may receive and transmit clock signals, command signals, address signals and data signals, etc.

The time based common sampling circuit 11a may include a sampling timing generator circuit 12 and an RHR state-control circuit 13. For example, the sampling timing generator circuit 12 may be provided for the plurality of memory banks 15 or for each memory bank of the plurality of memory banks 15 (e.g., Bank0, ... Bank7). For example, the RHR state-control circuit 13 may receive an RXCNT signal. from the peripheral circuit 18. For example, the RXCNT signal may be provided at an end of each refresh operation. The RHR state-control circuit 13 may count responsive to the RXCNT signal in an active state, and may provide an instruction signal StealSlot for executing row hammer refresh (RHR) instead of normal refresh. The sampling timing generator circuit 12 may receive the instruction signal Steal Slot from the RHR state-control circuit 13 and may further receive a frequency-divided RHR oscillation signal (RhrOsc) from an oscillator block 14 for self-refresh. The sampling timing generator circuit 12 may provide a trigger signal for sampling (ArmSample) to a sampling circuit 16 of each memory bank of the plurality of memory banks 15 (e.g., Bank0, ... Bank 7) at a random timing. The ArmSample signal may be randomized by randomization of a frequency of the activation of the Arm-Sample signal and a difference between an interval of RHR execution (e.g., each time auto-refresh command is provided) and an interval (e.g., a cycle) of the frequency-divided RHR oscillation signal (RhrOsc). For example, the time based common sampling circuit 11a may further include an interval measurement circuit 17. The interval measurement circuit 17 may dynamically measure the interval of RHR execution (e.g., each time auto-refresh command is provided) based on the interval of the frequency-divided RHR oscillation signal (RhrOsc) received, and may further generate and provide a steal rate timing signal in four bits ("Y<3:0>") indicative of a timing of Steal Slot in order to adjust or optimize a steal rate at which the RHR is executed after normal refreshes.

Responsive to the ArmSample signal, the sampling circuit 16 may provide a sampling signal (Sample1). A latch 19 (e.g., a latch, a flip-flop, etc.) of each memory bank of the plurality of memory banks 15 (e.g., Bank0, ... Bank7) may capture (e.g., latch) a column (X) address responsive to the sampling signal (Sample1), an adjacent address of the column address may be calculated and provided as an RHR refresh address. For example, the sampling circuit 16 may provide the sampling signal (Sample1) a plurality of times in the interval of RHR execution and the captured address may be overwritten each time, and an adjacent address of the address most recently captured becomes a valid address that is to be finally applied to the RHR refresh address and provided as an address to a peripheral circuit 18 that handles clock signals, command signals, address signals and data signals.

Figure 2A:
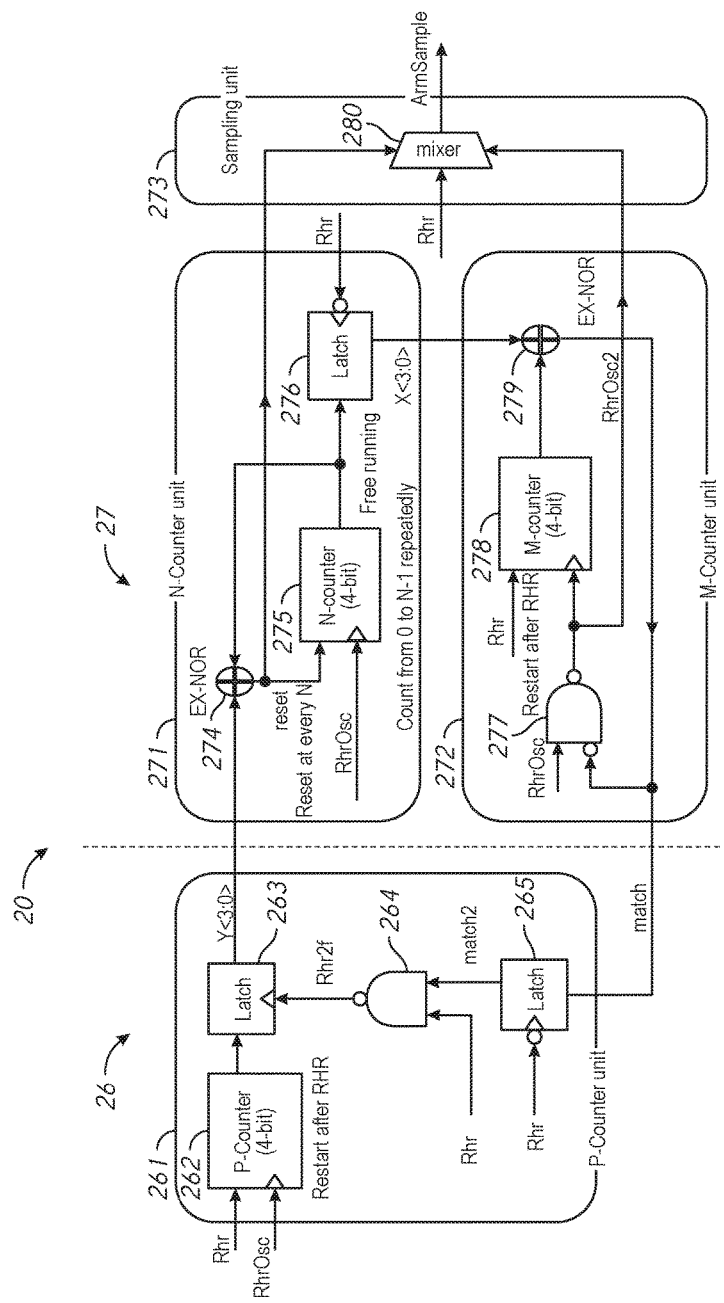
FIG. 2A is a schematic diagram of a time based sampling circuit including a sampling timing generator circuit and an interval measurement circuit in accordance with an embodiment of the present disclosure.

FIG. 2A is a schematic diagram of a time based sampling circuit 20 that may include an interval measurement circuit 26 and a sampling timing generator circuit 27 in accordance with an embodiment of the present disclosure. For example, the time based sampling circuit 20 may be the time based sampling circuit 11 in FIG. 1. For example, the interval measurement circuit 26 may be the interval measurement circuit 17 in FIG. 1. For example, the sampling timing generator circuit 27 may be the sampling timing generator circuit 12 in FIG. 1.

The interval measurement circuit 26 may dynamically measure the interval of RHR execution (e.g., each time auto-refresh command is provided) using the interval of the frequency-divided RHR oscillation signal (RhrOsc) received as a count cycle, and may further generate and provide a period of counter circuit in four bits as "Y<3:0>" signals indicative of a timing of Steal Slot in order to detect or capture a steal rate at which the RHR is executed after normal refreshes. The interval measurement circuit 26 may include a P-counter unit 261. The P-counter unit 261 may include a P-counter 262 that may continuously count an integer from 0 in an incremental manner responsive to the frequency-divided RHR oscillation signal (RhrOsc), and the P-counter 262 may provide a count signal. The P-counter 262 may be reset responsive to an RHR instruction signal Rhr that is generated from a refresh signal Rfsh and the instruction signal StealSlot. The P-counter unit 261 may also include a latch 265 and a logic circuit 264. The latch 265 may receive a match signal (described later in details) from the sampling timing generator circuit 27, latch the match signal by an inversion of the RHR instruction signal Rhr and provide an intermediate match signal match2. The logic circuit 264 may be a NAND circuit that may receive the intermediate match signal match2 and the RHR instruction signal Rhr and provide a trigger signal Rhr2f to a latch 263. The latch 263 may receive the count signal from the P-counter 262, latch the count signal with the trigger signal Rhr2f and provide the Y<3:0> signals to the sampling timing generator circuit 27.

The sampling timing generator circuit 27 may include an N-counter unit 271 that may receive the Y<3:0> signals, the frequency-divided RHR oscillation signal (RhrOsc) and the RHR instruction signal Rhr. For example, if the Y<3:0> signals represent an integer N (e.g., "5"), an N-counter 275 in the N-counter unit 271 may continuously count an integer from 0 to (N−1) (e.g., "4") in an incremental manner up to the integer N (e.g., "5") represented by the Y<3:0> signals, such as 0, 1, 2 ..., N−1, responsive to the frequency-divided RHR oscillation signal (RhrOsc), and the N-counter 275 may provide a count signal. The N-counter 275 may be reset when the integer matches the integer N (e.g., "5"), responsive to a reset signal. For example, a comparator 274 may be a logic exclusive NOR circuit that may receive the count signal and the Y<3:0> signals and may further provide the reset signal. The RHR instruction signal Rhr may be provided apart from the frequency-divided RHR oscillation signal (RhrOsc) asynchronously, to a latch circuit 276. The latch circuit 276 may latch the count signal (e.g., "3") responsive to the RHR instruction signal Rhr and may further provide the latched count signal as a latched signal X<3:0> (e.g., indicative of "3") to an M-counter unit 272. In the M-counter unit 272, an M-counter 278 may start counting in an incremental manner to an integer M (e.g., "3") responsive to an intermediate frequency-divided RHR oscillation signal (RhrOsc2) that a logic circuit 277 may provide responsive to the frequency-divided RHR oscillation signal (RhrOsc). The M-counter 278 may provide a count to a comparator 279. For example, the comparator 279 may be a logic exclusive NOR circuit. The comparator 279 may compare the count from the M-Counter 278 and the latched signal X<3:0> (e.g., "3") from the N-counter unit 271. If the count of the M-counter 278 matches the latched signal X<3:0>, the comparator 279 may provide a match signal which may control a logic circuit 277 to stop providing an RhrOsc2 signal to the M-counter 278 and a mixer 280 in a sampling unit 273. For example, the logic circuit 277 may be a NAND circuit that may receive an inversion of the match signal and the frequency-divided RHR oscillation signal (RhrOsc) and may further provide the intermediate frequency-divided RHR oscillation signal (RhrOsc2). For example, the mixer 280 may receive the reset signal from the comparator 274. The mixer 280 may also receive the intermediate frequency-divided RHR oscillation signal (RhrOsc2) and the RHR instruction signal Rhr, and provide the intermediate frequency-divided RHR oscillation signal (RhrOsc2) as the trigger signal for sampling (ArmSample) while the count of M-counter 278 is below (e.g., 0, 1, 2) the latched signal X<3:0> (e.g., "3") until the count of M-counter 278 matches the latched signal X<3:0>. The latch circuit 19 may update a row address each time responsive to the trigger signal for sampling (ArmSample), and a final updated row address is used for Rhr operation. The value of the latched signal X<3:0> may be randomly determined, thus a latching interval may become random.

Figure 2B:
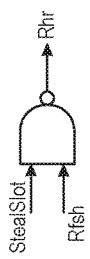
FIG. 2B is a circuit diagram of a row hammer refresh (Rhr) signal generator in the time based sampling circuit in accordance with an embodiment of the present disclosure.

FIG. 2B is a circuit diagram of a row hammer refresh (Rhr) signal generator in the time based sampling circuit 20 in accordance with an embodiment of the present disclosure. For example the row hammer refresh (Rhr) signal generator may be an AND circuit that may provide the RHR instruction signal Rhr based on the Rfsh signal for signaling refresh operations and the instruction signal StealSlot. For example, the one-shot Rhr signal may be provided every eight pulses of the Rfsh signal when a steal rate (the interval of RHR execution) is set to ⅛ (RHR is executed every eight refresh operations) as indicated by the StealSlot signal.

Figure 3:
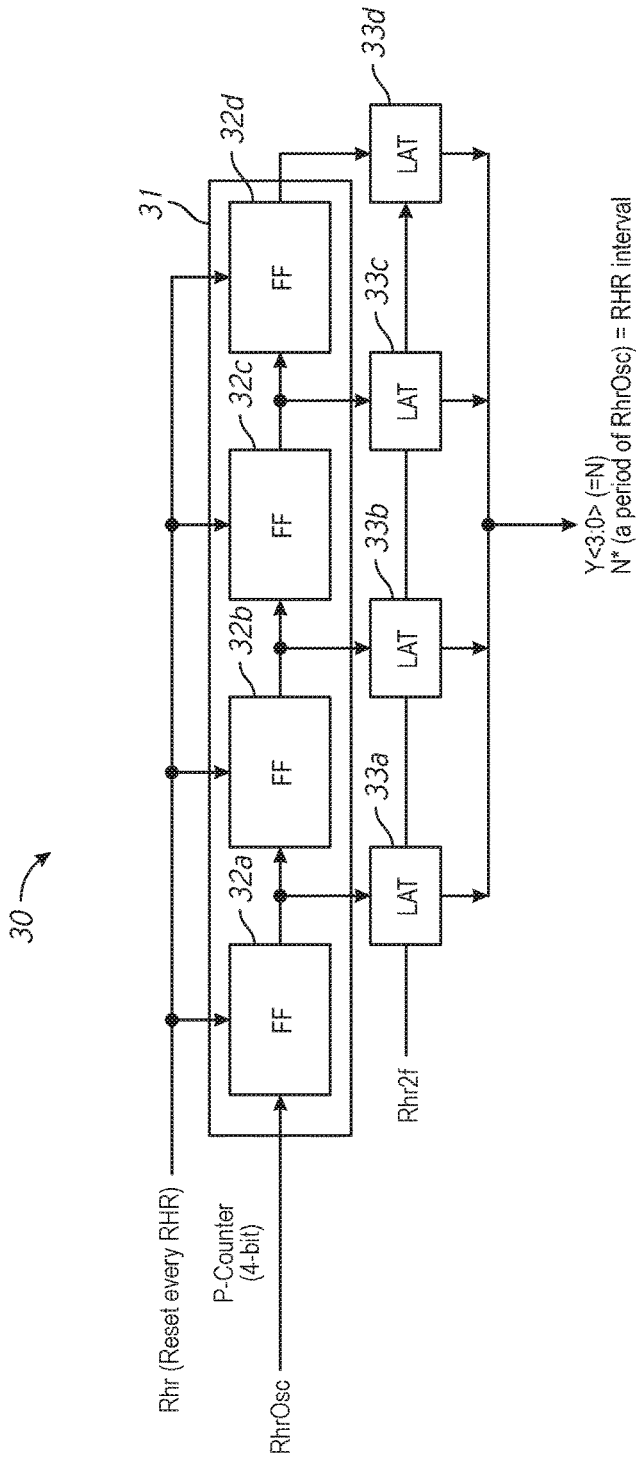
FIG. 3 is a block diagram of a counter in the interval measurement block in FIG. 2 in accordance with an embodiment of the present disclosure.

FIG. 3 is a block diagram of a counter 30 in the interval measurement block in FIG. 2A in accordance with an embodiment of the present disclosure. For example, the counter 30 may be a portion of the P-counter unit 261. For example, the counter 30 may include a P-counter 31 that may be the P-counter 262 of FIG. 2A. The P-counter 31 may include four flip-flop (FF) circuits 32a, 32b, 32c and 32d coupled in cascade connection. The flip-flop circuit 32a may receive the frequency-divided RHR oscillation signal (RhrOsc) for self-refresh from an oscillator (e.g., the oscillator block 14) and may further provide an output signal to the flip-flop circuit 32b and a latch 33a. The flip-flop circuit 32b may receive the output signal from the flip-flop circuit 32a and provide an output signal to the flip-flop circuit 32c and a latch 33b. The flip-flop circuit 32c may receive the output signal from the flip-flop circuit 32b and provide an output signal to the flip-flop circuit 32d and a latch 33c. The flip-flop circuit 32d may receive the output signal from the flip-flop signal 32c and provide an output signal to a latch 33d. The flip-flop circuits 32a, 32b, 32c and 32d may be reset every RHR interval by the RHR instruction signal Rhr. The latches 33a, 33b, 33c and 33d may work as the latch 263 in FIG. 2A. The latches 33a, 33b, 33c and 33d may latch the corresponding output signals from the flip-flop circuits 32a, 32b, 32c and 32d with the trigger signal Rhr2f which provides a latch timing delayed from the RHR instruction signal Rhr. The latches 33a, 33b, 33c and 33d may provide the "Y<3:0>" signals indicative of an integer N that is variable based on the interval measurement. An interval of the RHR instruction signal Rhr may be indicated by NxtRhrOsc (tRhrOsc=a period of the frequency-divided RHR oscillation signal (RhrOsc)). For example, the P-counter 31 and the frequency-divided RHR oscillation signal (RhrOsc) may have a relationship that the P-counter 31 may be able to count a period that is approximately equal to an actual interval for executing row hammer refresh, rather than having a slightly longer period.

Figure 4:
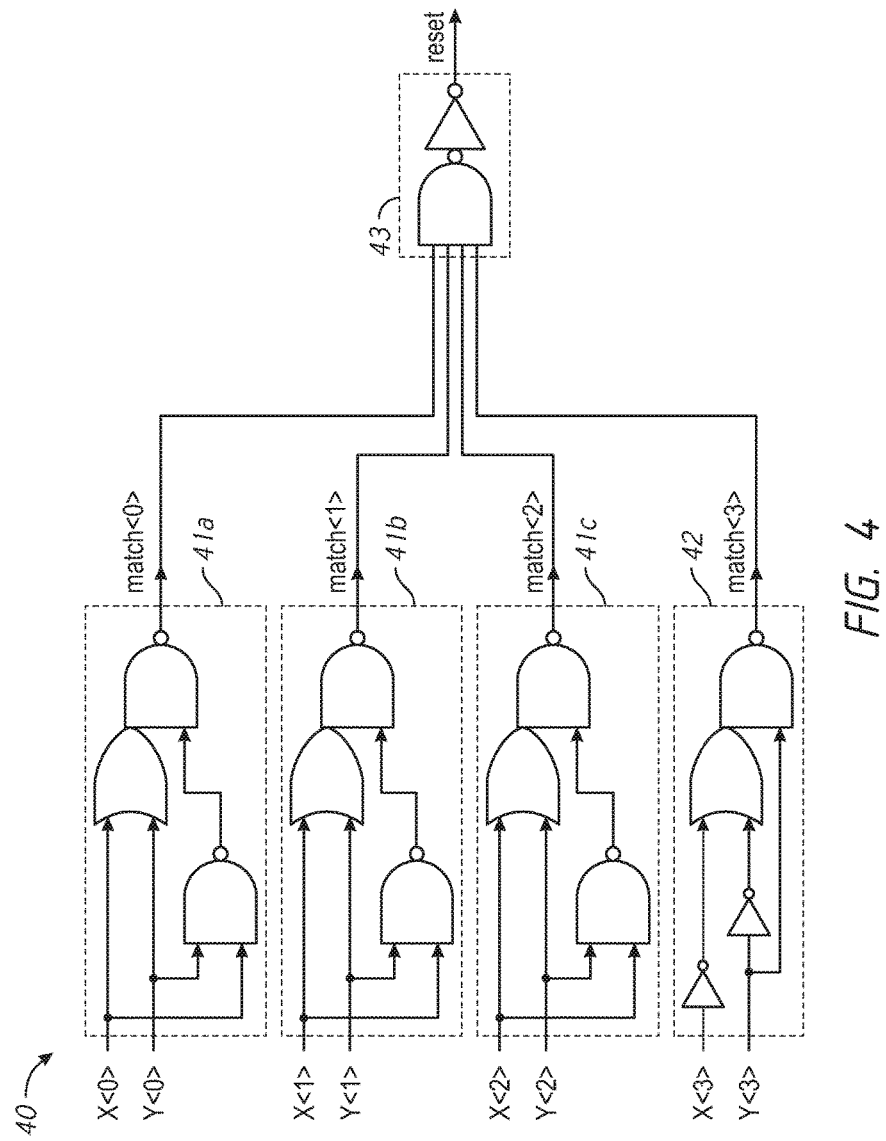
FIG. 4 is a block diagram of a comparator in the arm sample generator in FIG. 2 in accordance with an embodiment of the present disclosure.

FIG. 4 is a block diagram of a comparator 40 in the arm sample generator in FIG. 2 in accordance with an embodiment of the present disclosure. For example, the comparator 40 may be the comparator 274 in FIG. 2A, which may receive the output signals from the N-counter 275 as X<3:0> signals and may further receive the Y<3:0> signals from the interval measurement circuit 26. The comparator 40 may include exclusive-NOR gates 41a, 41b and 41c. The exclusive-NOR gates 41a, 41b and 41c may receive a combination of corresponding bits of X and Y signals, such as X<0> and Y<0>, X<1> and Y<1> and X<2> and Y<2>, respectively and may provide match signals <0>, <1>, <2> in an active state if the combination of corresponding bits of X and Y signals are indicative of the same value (e.g., "0" and "0", "1" and "1"). If the combination of corresponding bits of X and Y signals are indicative of different values, the exclusive-NOR gates 41a, 41b and 41c may provide match signals <0>, <1>, and <2> in an inactive state.

The comparator 40 may also include a logic gate 42. The logic gate 42 may receive a combination of X<3> and Y<3> signals that are most significant bits of X and Y signals. The logic gate 42 may provide a match signal in an active state, either when the Y<3> signal is "0" or when the combination of corresponding bits of X<3> and Y<3> signals are indicative of the same values. The comparator 40 may also include an adder circuit 43 that may receive output signals from the exclusive-NOR gates 41a to 41c and the logic gate 42 and may further provide a reset signal that is active responsive to the output signals, when the combination of corresponding bits of X<0:2> and Y<0:2> signals are identical and either if X<3> and Y<3> signals also match or if the Y<3> is zero regardless of match status in the most significant bits of the X and Y signals.

Figure 5:
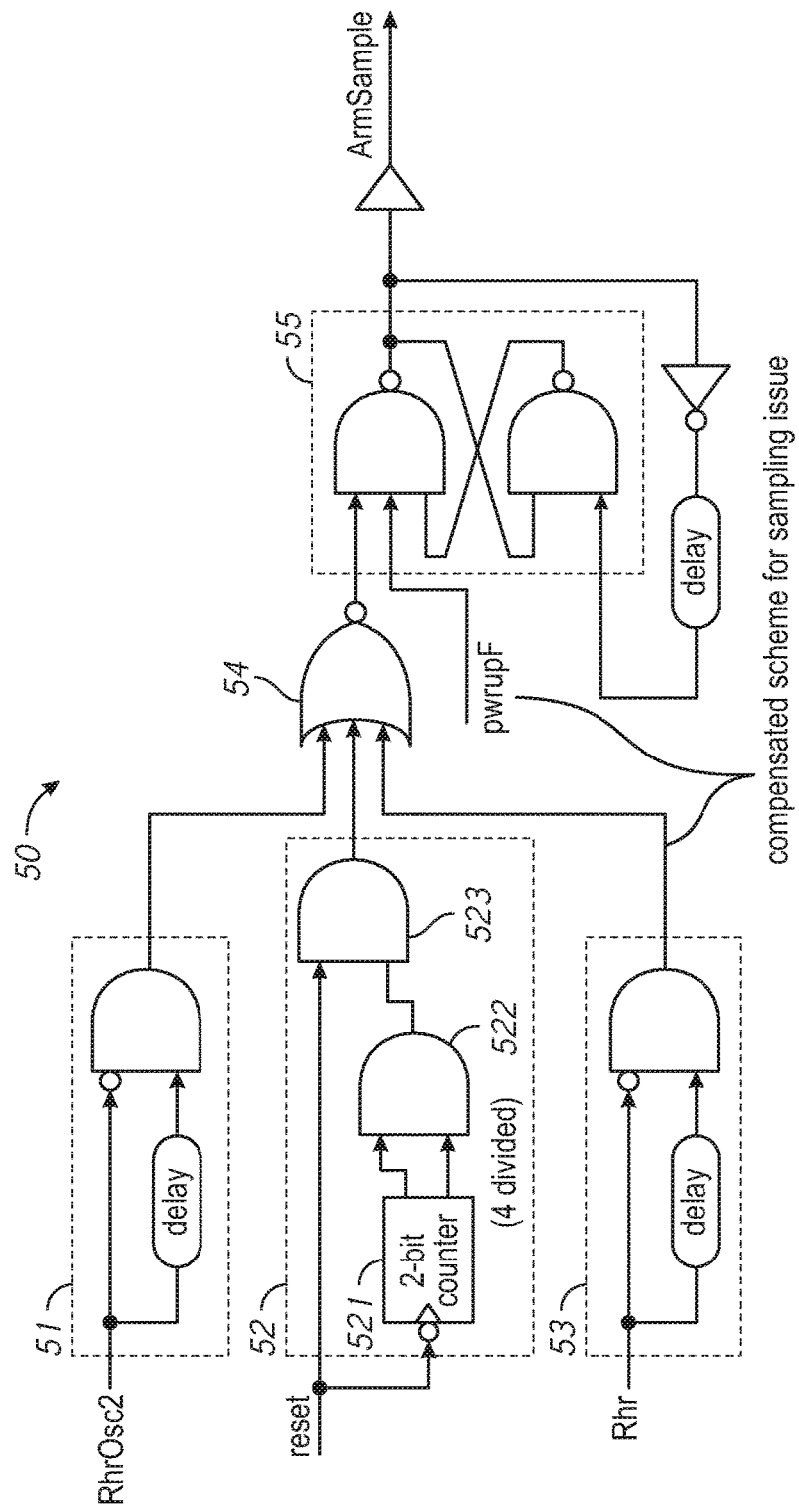
FIG. 5 is a circuit diagram of a sampling unit in the arm sample generator in FIG. 2 in accordance with an embodiment of the present disclosure.

FIG. 5 is a circuit diagram of a sampling unit 50 in the arm sample generator in FIG. 2 in accordance with an embodiment of the present disclosure. For example, the sampling unit 50 may be the sampling unit 273 in FIG. 2A. The sampling unit 50 may receive the intermediate frequency-divided RHR oscillation signal (RhrOsc2) (e.g., the RhrOsc2 signal from the logic circuit 277), the RHR instruction signal Rhr and the reset signal (e.g., the reset signal from the comparator 274 in FIG. 2A). The sampling unit 50 may include an RhrOsc2 pulse circuit 51 and an RHR pulse circuit 53. The RhrOsc2 pulse circuit 51 may provide a pulse signal with a pulse width corresponding to a delay circuit in the RhrOsc2 pulse circuit 51 at an end (e.g., a falling edge) of an active period of the intermediate frequency-divided RHR oscillation signal (RhrOsc2). The RHR pulse circuit 53 may provide a pulse signal with a pulse width corresponding to a delay circuit in the RHR pulse circuit 53 at an end (e.g., a falling edge) of an active period of the RHR instruction signal Rhr. The sampling unit 50 may also include a reset divider circuit 52. The reset divider circuit 52 may include a 2-bit counter 521 that may provide two active signals as output signals every four counts (and a frequency is four times). Thus, a first AND circuit 522 in the reset divider circuit 52 that may receive the two active output signals from the 2-bit counter 621 may provide an active output signal every four counts. A second AND circuit 523 in the reset divider circuit 52 may provide an intermediate reset signal that may be active responsive to the active reset signal and the output signal of the first AND circuit 522 that may also be active but at every four counts of the 2-bit counter 521. Thus, when the interval of RHR execution becomes longer (e.g., Y<3:0> increases to a larger value) and the N-counter 27 in FIG. 2A still keeps counting the earlier smaller number N, the sampling unit 50 may provide the intermediate reset signal. The sampling unit 50 may include a logic circuit 54 that may receive the output signals from the RHROsc2 pulse circuit 51, the RHR pulse circuit 53 and the reset divider circuit 52. If either one of these output signals is active, then the logic circuit 54 may provide an active low signal (e.g., at a logic low level for being active) to a latch circuit 55. For example, the latch circuit 55 may be a flip-flop circuit or a set-reset latch, may be set by either the output signal of the active low signal from the logic circuit 54 or an inversion of a power-up signal (pwrupF) for an entire device. Thus, the latch circuit 55 may provide a trigger signal for sampling (ArmSample) to a sampling circuit (e.g., the sampling circuit 16 in FIG. 1). The trigger signal for sampling (ArmSample) with an inversion and a delay may also be provided to the flip-flop circuit 55 to reset the latch circuit 55.

Figure 6:
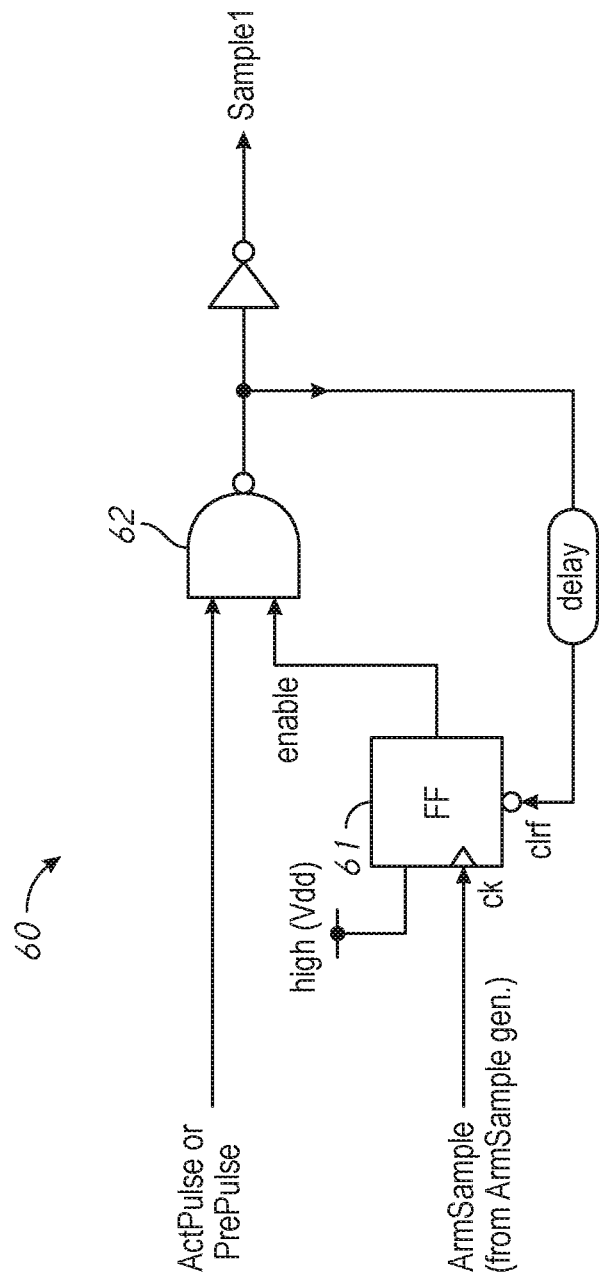
FIG. 6 is a circuit diagram of a sampling circuit in each bank in FIG. 1 in accordance with an embodiment of the present disclosure.

FIG. 6 is a circuit diagram of a sampling circuit 60 in each bank in FIG. 1 in accordance with an embodiment of the present disclosure. For example, the sampling circuit 60 may be the sampling circuit 16 in FIG. 1. For example, the sampling circuit may include a latch circuit 61 and a NAND circuit 62. For example, the latch circuit may be a flip-flop that may receive the trigger signal for sampling (ArmSample) from the sampling timing generator circuit 12 at a clock input and a positive power potential (Vdd, a logic high level) at a data input and provide a latched ArmSample signal as an enable signal to the NAND circuit 62. The NAND circuit 62 may receive ActPulse signal or PrePulse signal that may be active for one bank among a plurality of banks. The NAND circuit 62 may provide the latched ArmSample signal after inversion as a sampling signal (Sample1), if the bank related to the received ActPulse signal or PrePulse signal is active. The latch circuit 61 may be reset by an inversion of the output signal of the NAND circuit 62 with a delay.

Figure 7:
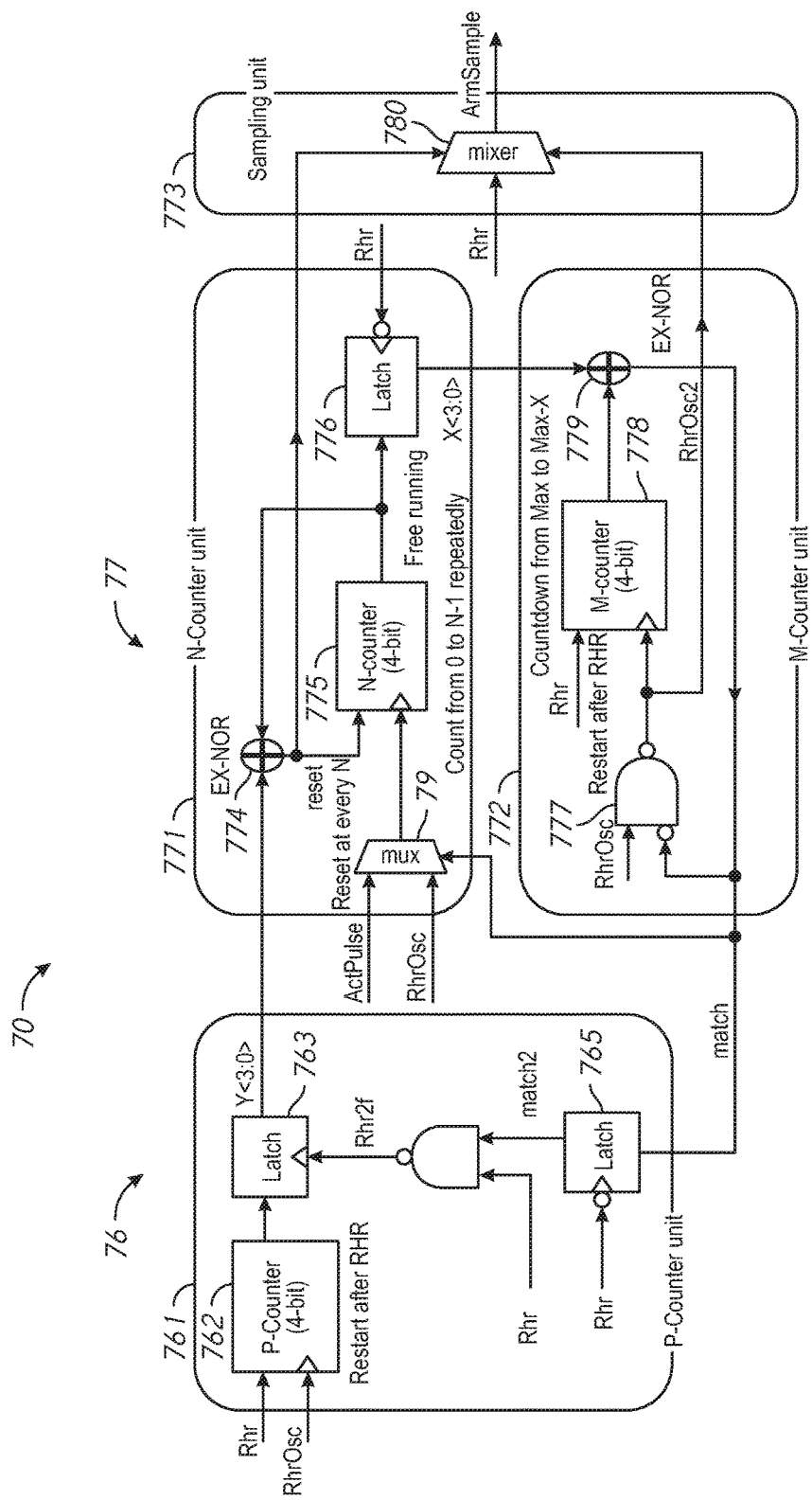
FIG. 7 is a schematic diagram of a time based sampling circuit including a sampling timing generator circuit and an interval measurement circuit in accordance with an embodiment of the present disclosure.

FIG. 7 is a schematic diagram of a time based sampling circuit including an sampling timing generator circuit and an interval measurement circuit in accordance with an embodiment of the present disclosure. Description of components corresponding to components included in FIG. 2A will not be repeated and changes from FIG. 2A including a multiplexer (mux) 79 will be described. An N-counter unit 771 may include the multiplexer (mux) 79 that receives the ActPulse signal indicative of an Active command and the frequency-divided RHR oscillation signal (RhrOsc). While the match signal is indicative of an inactive state (a match has not been detected yet), the multiplexer 79 may provide the ActPulse signal that may be received more frequently than the frequency-divided RHR oscillation signal (RhrOsc) for improved randomness, and the multiplexer 79 may provide the frequency-divided RHR oscillation signal (RhrOsc) once the match signal is in an active state (a match is detected).

Figure 8:
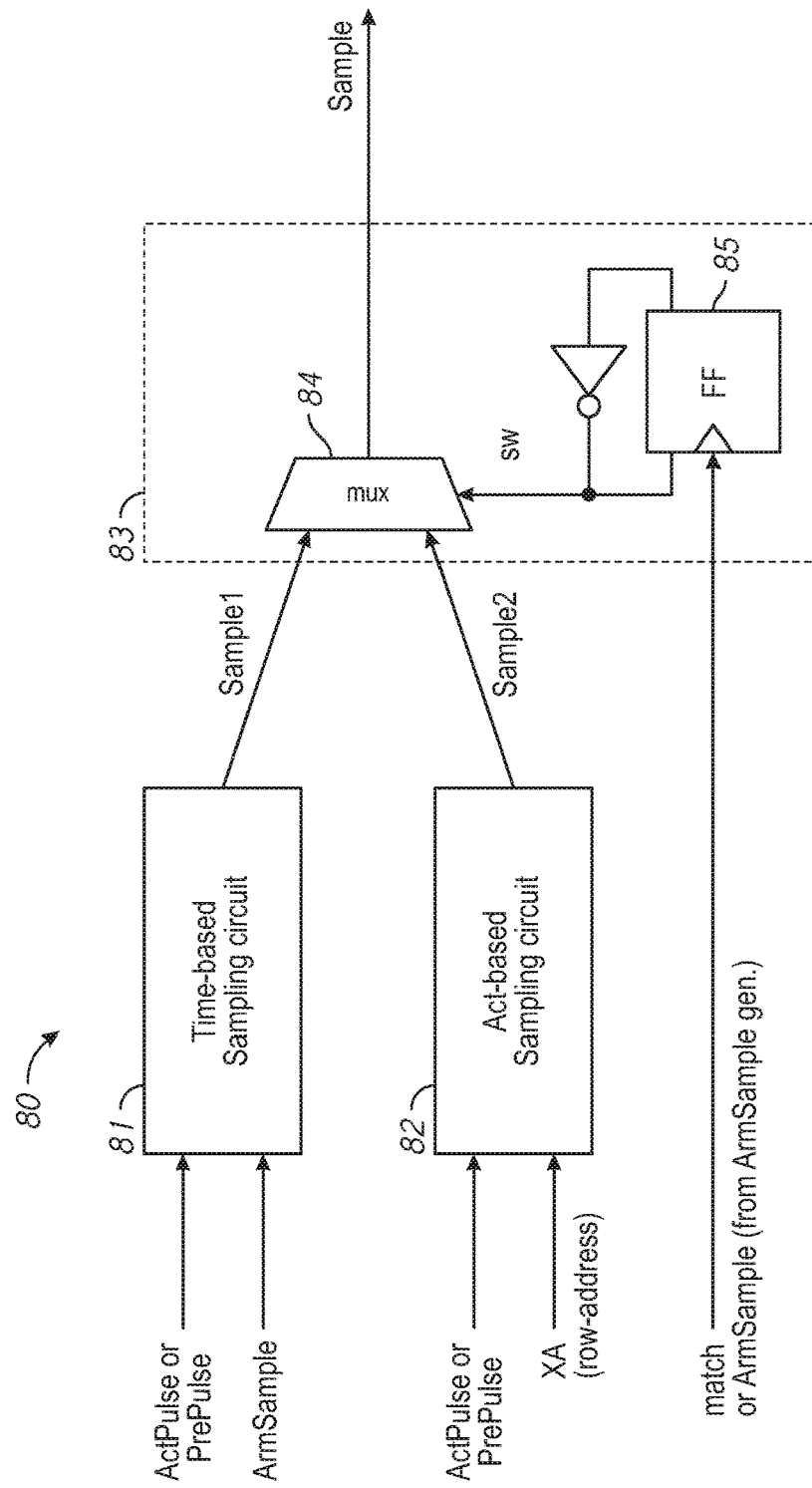
FIG. 8 is a schematic diagram of a hybrid sampling circuit in accordance with an embodiment of the present disclosure.

It is possible to provide sampling signals from time based sampling and command (act) based sampling based on the match signal or the trigger signal for sampling (ArmSample). FIG. 8 is a schematic diagram of a hybrid sampling circuit 80 in accordance with an embodiment of the present disclosure. For example, the hybrid sampling circuit 80 may include a time based sampling circuit 81, a command based sampling circuit 82, (e.g., an act based sampling circuit based on Act command), and a mixing circuit 83. For example, the time based sampling circuit 81 may be the bank sampling circuit 11b in FIG. 1 that receives either ActPulse or PrePulse signal responsive to either Act command or Precharge command and the trigger signal for sampling (ArmSample), and provides a sampling signal (Sample1). The act based sampling circuit 82 may be a sampling circuit that receives a command based pulse signal such as the ActPulse signal or the PrePulse signal and a row address (XA) for the command and provides a sampling signal (Sample2). The mixing circuit 83 may include a multiplexer 84 and a latch circuit (e.g., a flip-flop) 85. The match signal may be in the active state once at a randomized timing within the interval for executing row hammer refresh. The latch circuit 85 may receive the match signal at a clock input and may provide an inversion of the match signal to the multiplexer 84 as a switch signal SW as well as a data input node of the latch circuit 85 to reset the latch circuit 85. Thus, the multiplexer 84 may provide either the sampling signal (Sample1) from the time based sampling circuit 81 or the sampling signal (Sample2) from the act based sampling circuit 82 responsive to the switch signal SW.

Figure 9:
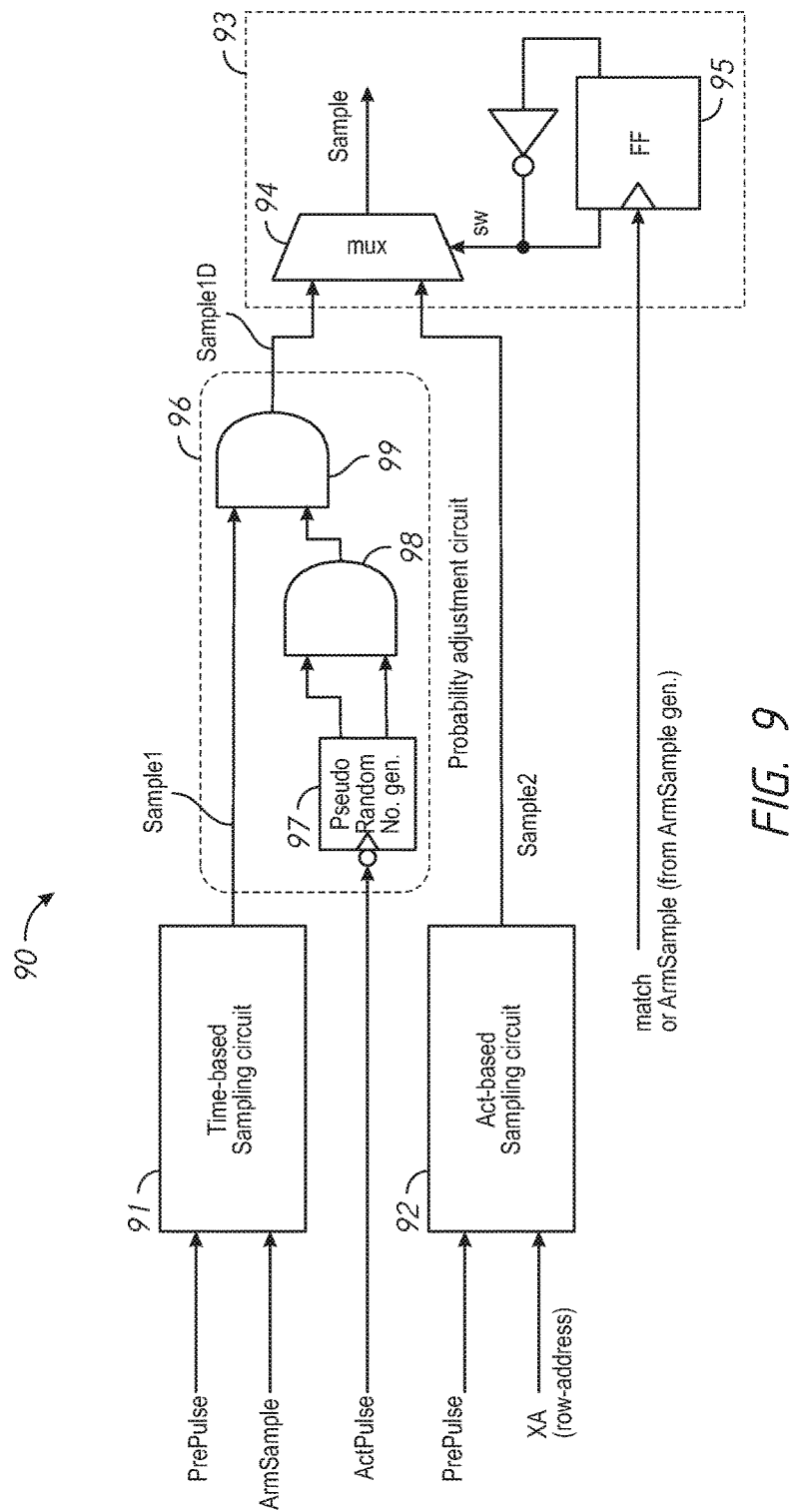
FIG. 9 is a schematic diagram of a hybrid sampling circuit in accordance with an embodiment of the present disclosure.

FIG. 9 is a schematic diagram of a hybrid sampling circuit 90 in accordance with an embodiment of the present disclosure. Description of components corresponding to components included in FIG. 8 will not be repeated and changes from FIG. 8 including a probability adjustment circuit 96 will be described. For example, a time based sampling circuit 91 and an act based sampling circuit 92 may receive the PrePulse signal, together with the trigger signal for sampling (ArmSample) and the row address signal XA, respectively. The hybrid sampling circuit 90 may include the probability adjustment circuit 96 that may receive the sampling signal (Sample1) signal from the time based sampling circuit 91 and the ActPulse signal and may further provide an adjusted sampling signal (Sample1D). The mixer circuit 93 may receive the adjusted sampling signal (Sample1D) from the probability adjustment circuit 96 instead of the sampling signal (Sample1). The probability adjustment circuit 96 may include a pseudo random number generator 97, an AND circuit 98 and a NAND circuit 99. The pseudo random number generator 97 may provide a plurality of bits representing a random number as output random signals that may not always match responsive to the ActPulse signal as a clock input. The AND circuit 98 may receive the output random signals as input signals and provide a result of an AND operation of the output random signals. The NAND circuit 96 may receive the result and the sampling signal (Sample1) and may provide a result of a NAND operation of the result and the sampling signal (Sample1). Thus, the adjusted sampling signal (Sample1D) may have an adjusted probability likely lower than a probability in the sampling signal (Sample1). Thus, higher priority may be given to a sampling based on the act based sampling circuit 92 than to a sampling based on the time based sampling circuit 91.

Figure 10:
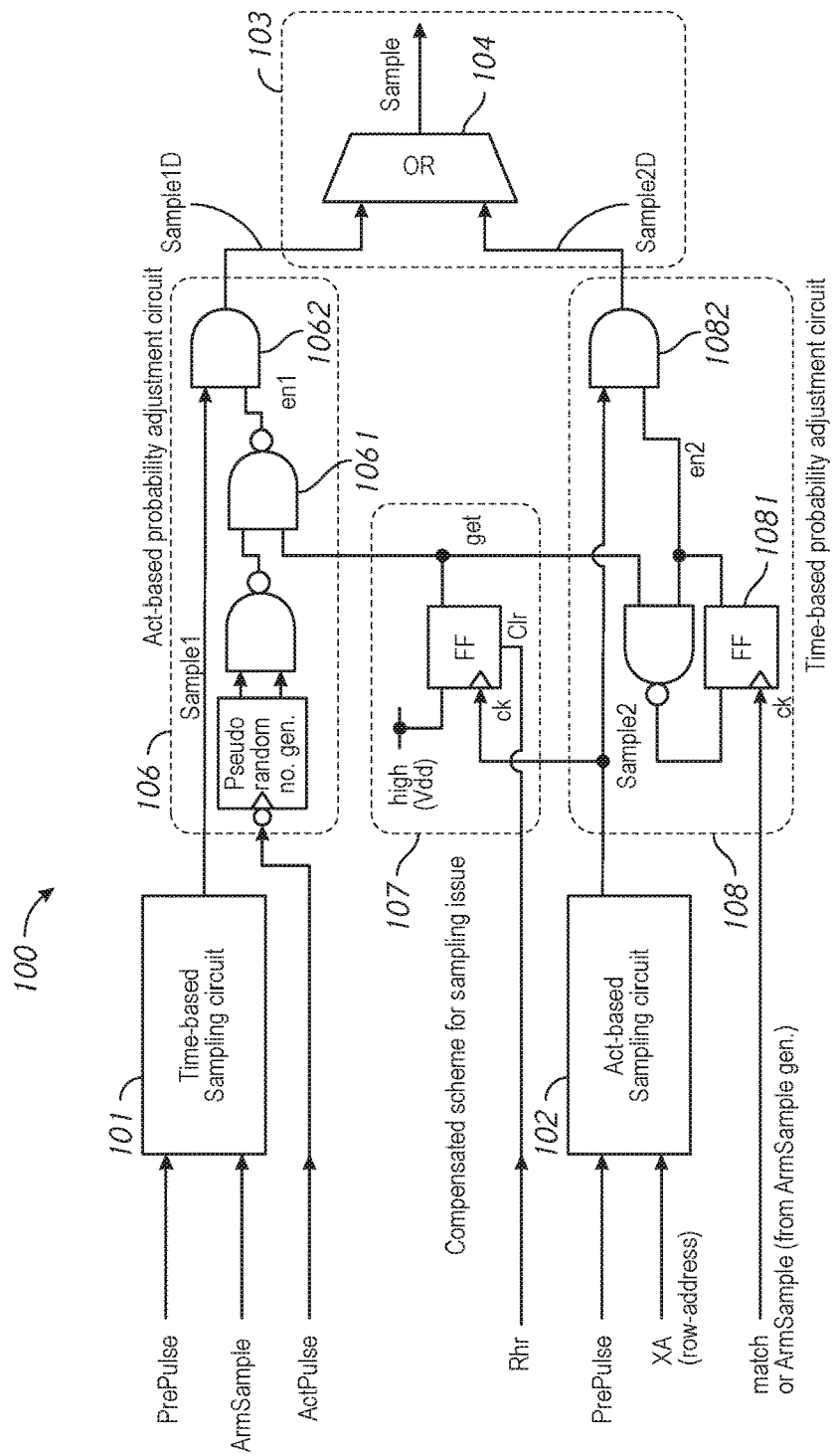
FIG. 10 is a schematic diagram of a hybrid sampling circuit in accordance with an embodiment of the present disclosure.

FIG. 10 is a schematic diagram of a hybrid sampling circuit 100 in accordance with an embodiment of the present disclosure. Description of components corresponding to components included in FIGS. 8 and 9 will not be repeated and changes from FIGS. 8 and 9 including a plurality of probability adjustment circuits 106 and 108 will be described. For example, a time based sampling circuit 101 and an act based sampling circuit 102 may receive the PrePulse signal, together with the trigger signal for sampling (ArmSample) and the row address signal XA, and may further provide sampling signals (Sample1) and (Sample2), respectively. The hybrid sampling circuit 100 may include an act based probability adjustment circuit 106 that may receive the sampling signal (Sample1) from the time based sampling circuit 101 and the ActPulse signal and may further provide an act-adjusted time based sampling signal (Sample1D). For example, he act based probability adjustment circuit 106 may include a logic circuit 1061 and a filter circuit 1062. For example, the logic circuit 1061 may receive a get signal from a latch circuit 107 and a randomized signal responsive to the ActPulse signal and may further provide an enable signal en1. As described later, the get signal is responsive to a state of the sampling signal (Sample2) and the RHR instruction signal Rhr. The filter circuit 1062 may be an AND circuit that may receive the enable signal en1 and the sampling signal (Sample1) and may further provide the act-adjusted time based sampling signal (Sample1D).

The hybrid sampling circuit 100 may also include a time based probability adjustment circuit 108. For example, the time based probability adjustment circuit 108 may include a flip-flop (FF) 1081 and a filter circuit 1082. The flip-flop (FF) 1081 may receive the match signal or the ArmSample signal and may further provide an enable signal en2, responsive, at least in part, to the get signal from the latch circuit 107 and the match signal or the ArmSample signal. The filter circuit 1082 may be an AND circuit that may receive the enable signal en2 and the sampling signal (Sample2) from the act based sampling circuit 102 and may further provide a time-adjusted act based sampling signal (Sample2D) that is the sampling signal (Sample2) when the enable signal en2 is in an active state.

For example, the latch circuit 107 may be a flip-flop that may receive the sampling signal (Sample2) from the act based sampling circuit 102 at a clock input, the RHR instruction signal Rhr at a reset input and a positive power potential (Vdd, a logic high level) at a data input, and may provide a latched sampling signal (Sample2) as the get signal, which may be reset by the RHR instruction signal Rhr, to the act based probability adjustment circuit 106 and the time based probability adjustment circuit 108. Responsive to the get signal, the filter circuit 1062 in the act based probability adjustment circuit 106 may provide the sampling signal (Sample1) as the act-adjusted time based sampling signal (Sample1D) until the latched sampling signal (Sample2) reflected as the get signal becomes active and the filter circuit 1062 may stop providing the sampling signal (Sample1) once the get signal becomes active. Thus, sampling within an interval of RHR execution may be suppressed.

A mixer circuit 103 may receive the act-adjusted time based sampling signal (Sample1D) and the time-adjusted act based sampling signal (Sample2D), and may further provide the sampling signal (Sample).

Figure 11:
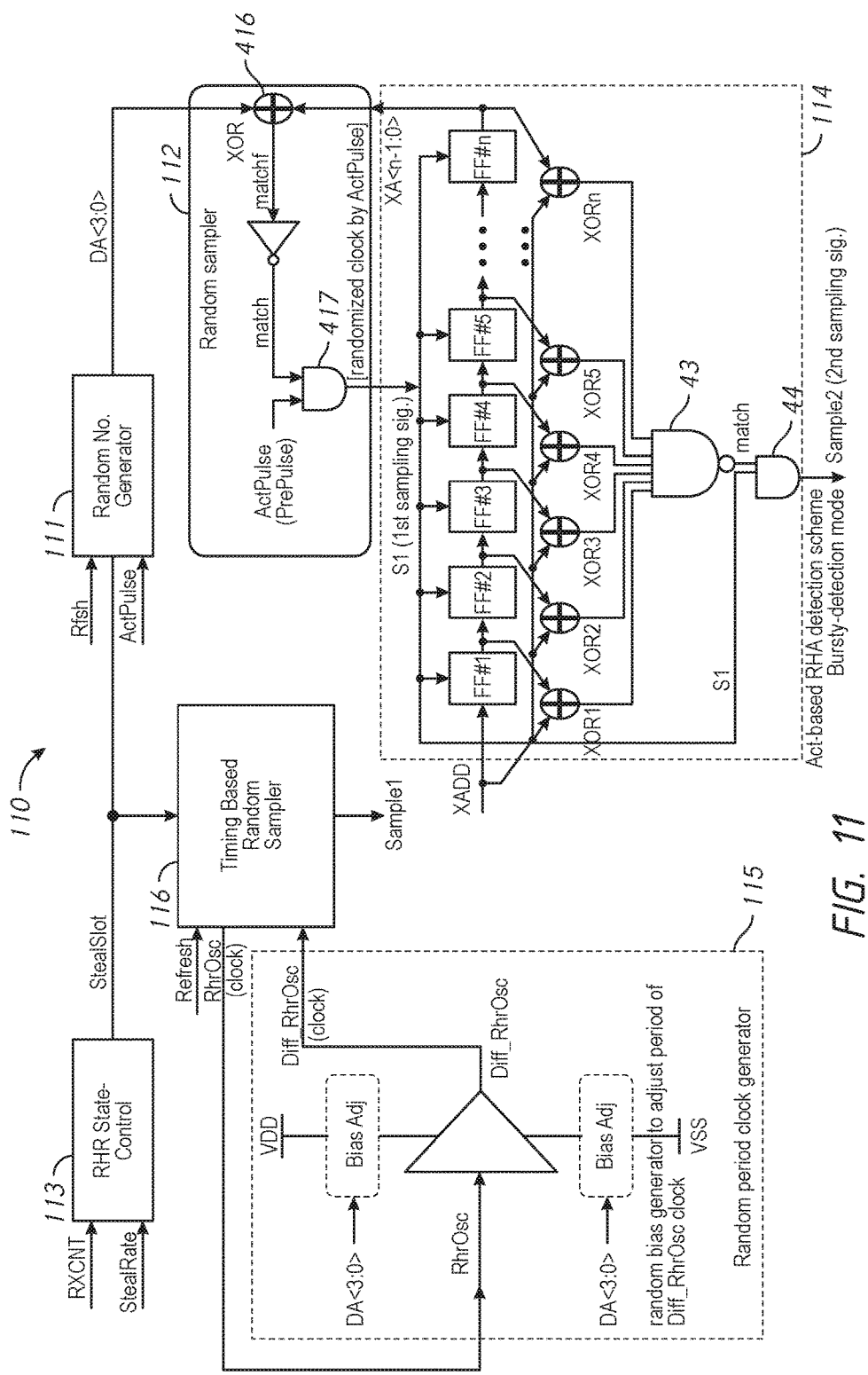
FIG. 11 is a schematic diagram of a hybrid sampling circuit in accordance with an embodiment of the present disclosure.

FIG. 11 is a schematic diagram of a hybrid sampling circuit 110 in accordance with an embodiment of the present disclosure. The hybrid sampling circuit 110 may include a random number generator 111, a random sampler 112, an RHR state-control circuit 113, a shift register 114, a random period clock generator 115 and a time based random sampler 116. For example, the RHR state-control circuit 113 may receive a StealRate signal and an RXCNT signal, and may provide an instruction signal StealSlot for executing row hammer refresh (RHR) instead of normal refresh. The random number generator 111 may receive the instruction signal StealSlot, a refresh signal Rfsh and the ActPulse signal, and may provide a randomized number DA<3:0> to the random sampler 112 and the random period clock generator 115. The random sampler 112 may include an exclusive OR gate circuit 416 and an AND gate circuit 417. The exclusive OR gate circuit 416 may provide a matchf signal by executing exclusive OR operation of the randomized number DA<3:0> and n-bits XA<n−1:0> of a captured address (e.g., a row address XADD) by the shift register 114. If all of the n-bits mutually match, the random sampler 112 may provide the matchf signal that may be inverted into the match signal. The AND gate circuit 417 may receive the match signal and either the ActPulse signal or the PrePulse signal, and may provide a first sampling signal S1 that is the ActPulse after randomization.

The shift register 114 may include n-stages of flip-flop circuits FF#1 to FF#n, which may latch a row address XADD, are in cascade connection. In other words, an output node of the flip-flop circuit of a former stage is connected to an input node of the flip-flop circuit of a later stage. The flip-flop circuits FF#1 to FF#n may receive the first sampling signal S1 at clock nodes thereof. When the first sampling signal S1 is in an active state, the flip-flop circuit FF#1 of a first stage may latch a current row address XADD, and the flip-flop circuits FF#1 to FF#n−1 may latch the row addresses XADD latched by preceding stages respectively and shift the row addresses XADD to the flip-flop circuits FF#2 to FF#n of following stages. The row address XADD latched by the flip-flop circuit FF#n, which is a last stage, may be discarded in response to next activation of the first sampling signal S1. Comparator circuits XOR1 to XORn may receive the latched row addresses XADD from the corresponding flip-flop circuits FF#1 to FF#n at first input nodes thereof, respectively. The comparator circuits XOR1 to XORn may also receive the current row address XADD at second input nodes thereof, respectively. When the current row address XADD matches any of the row addresses XADD latched by the flip-flop circuits FF#1 to FF#n, the corresponding comparator circuit of the any matched flip-flop circuit may provide a signal in an active state (e.g., a logic low level signal indicative of the match), and a NAND gate circuit 43 may provide a match signal in an active state (e.g., a logic high level signal indicative of the match). An AND gate circuit 44 may receive the match signal and the first sampling signal S1. When both of the match signal and the first sampling signal S1 are both in an active state (e.g., a logic high level signal indicative of the match), the AND gate circuit 44 may provide a second sampling signal S2 in an active state (e.g. a logic high level signal indicative of the match). More specifically, the second sampling signal S2 may be activated, if the row address XADD matches any of past row addresses XADD latched stored in the flip-flop circuits FF#1 to FF#n when the first sampling signal S1 is activated. In other words, the access to the word lines WL may be intermittently monitored, and, if the access to the same word line WL is captured two times or more within a predetermined period of time, the second sampling signal S2 may be activated.

Figure 12:
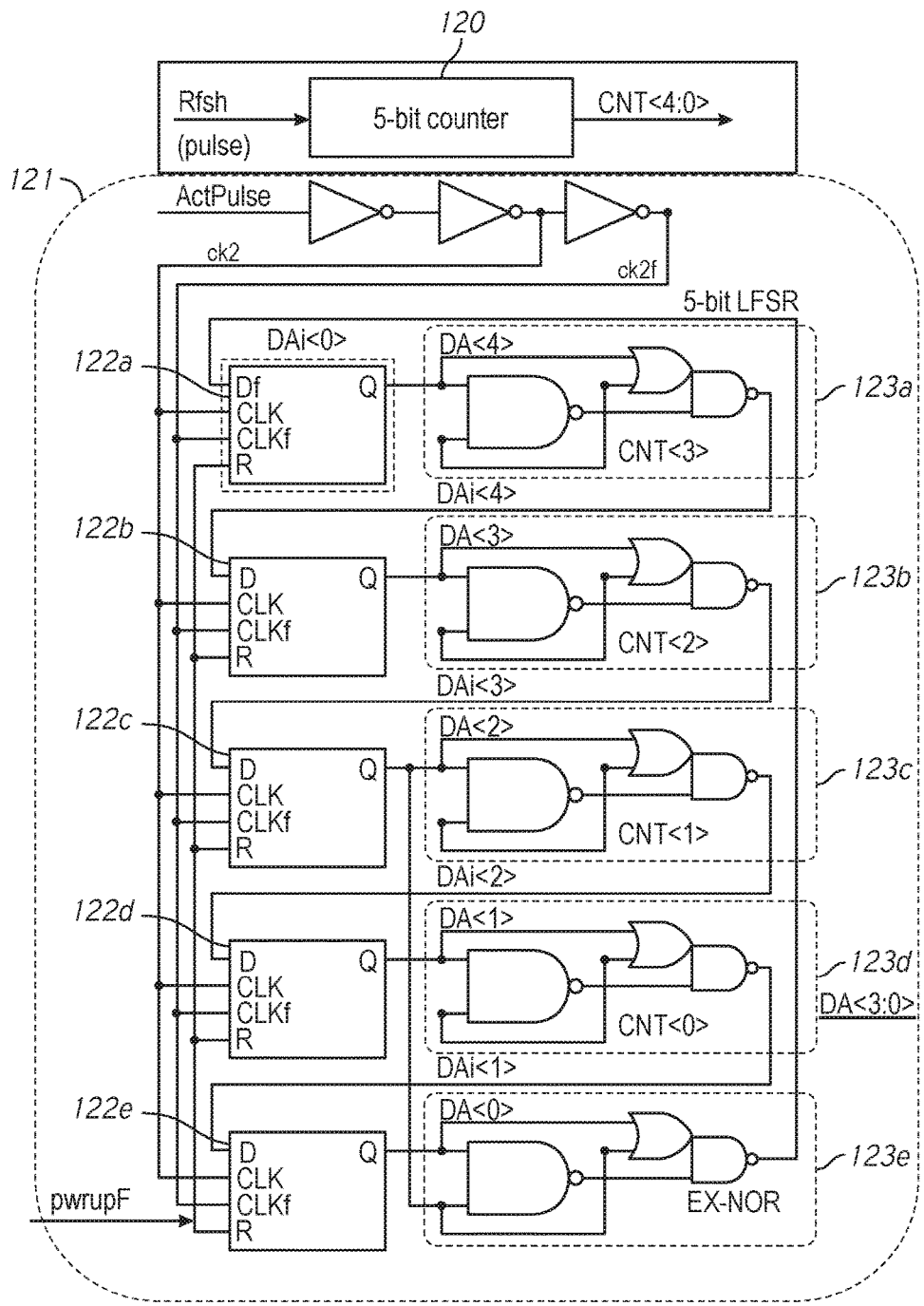
FIG. 12 is a circuit diagram of a pseudo random-number generator circuit by a linear feedback shift register (LFSR) computation circuit in accordance with an embodiment of the present disclosure.

FIG. 12 is a circuit diagram of a pseudo random-number generator circuit by a linear feedback shift register (LFSR) computation circuit 121 in accordance with an embodiment of the present disclosure. The linear feedback shift register (LFSR) computation circuit 121 may be a multi-bit LFSR for randomization that may be coupled to a counter 120 that may receive a refresh signal Rfsh as a pulse signal and may provide five bit count signals CNT<4:0>. The linear feedback shift register (LFSR) computation circuit 121 may include a plurality of (e.g., five) flip-flop circuits 122a to 122e that may receive the ActPulse signal as ck2 and its complementary signal ck2f at clock nodes CLK and CLKf, and an inversion of a power-up signal (pwrupF) at reset nodes. The linear feedback shift register (LFSR) computation circuit 121 may further include a plurality of (e.g., five) exclusive OR circuits 123a to 123e that may be coupled to the plurality of corresponding flip-flop circuits 122a to 122e. The flip-flop circuit 122a may receive an inversion of an output signal DAi<0> of the exclusive OR circuit 123e and provide DA<4> signal to the exclusive OR circuit 123a. The exclusive OR circuit 123a may receive the DA<4> signal from the flip-flop circuit 122a and the CNT<3> signal from the counter 120 and may further provide an output signal DAi<4>. The flip-flop circuit 122b may receive the output signal DAi<4> of the exclusive OR circuit 123a and provide DA<3> signal to the exclusive OR circuit 123b. The exclusive OR circuit 123b may receive the DA<3> signal from the flip-flop circuit 122b and the CNT<2> signal from the counter 120 and may further provide DAi<3> signal. The flip-flop circuit 122c may receive the output signal DAi<3> of the exclusive OR circuit 123b and provide DA<2> signal to the exclusive OR circuits 123c and 123e. The exclusive OR circuit 123c may receive the DA<2> signal from the flip-flop circuit 122c and the CNT<1> signal from counter 120 and may further provide DAi<2> signal. The flip-flop circuit 122d may receive the output signal DAi<2> of the exclusive OR circuit 123c and provide DA<1> signal to the exclusive OR circuit 123d. The exclusive OR circuit 123d may receive the DA<1> signal from the flip-flop circuit 122d and the CNT<0> signal from the counter 120 and may further provide DAi<1> signal. The flip-flop circuit 122e may receive the output signal DAi<1> of the exclusive OR circuit 123d and provide DA<0> signal to the exclusive OR circuit 123e. The exclusive OR circuit 123e may receive the DA<0> signal from the flip-flop circuit 122e and the DA<2> signal from the flip-flop circuit 122c and may further provide DAi<O> signal to the flip-flop circuit 122a. The above structural configuration of the linear feedback shift register (LFSR) computation circuit 121 is merely an example, and any randomization circuit may be used in place of the linear feedback shift register (LFSR) computation circuit 121.

Logic levels of signals, types of transistors, types of data input circuits used in the embodiments described the above are merely examples. However, in other embodiments, combinations of the logic levels of signals, types of transistors, types of data input circuits other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a row hammer control circuit configured to provide a row hammer control signal that is in an active state at variable intervals, the row hammer control signal including a first active state, a second active state and a third active state, the second active state being between the first and third active states, each of the first, second and third active states configured to cause a row hammer refresh operation;
   a latch circuit configured to temporarily store a row address on which the row hammer refresh operation is performed;
   a first counter circuit configured to count a number of pulses of a clock signal as a first count from the first active state to the second active state of the row hammer control signals and further configured to provide the first count; and
   a second counter circuit configured to start counting a number of pulses of the clock signal as a second count responsive, at least in part, to the third active state of the row hammer control signal and further configured to assert a timing signal when the second count is equal to or greater than zero and less than the first count value,
   wherein the latch circuit is further configured to update the row address, responsive, at least in part, to the timing signal.

2. The apparatus of claim 1, further comprising an oscillator circuit configured to provide the pulses of the clock signal having a substantially fixed cycle.

3. The apparatus of claim 2, wherein the oscillator circuit is configured to provide the pulses of the clock signal in a period of time other than a self-refresh operation.

4. The apparatus of claim 1, wherein the second counter circuit includes:
   a first logic circuit configured to count the pulses of the clock signal as a third count, and further configured to be reset when the third count becomes the first count value;
   a second logic circuit configured to latch the third count of the first logic circuit responsive to the third active state of the row hammer control signal; and
   a third logic circuit configured to start counting the pulses of the clock signal as a fourth count responsive to the third active state of the row hammer control signal and further configured to provide the timing signal when the fourth count becomes the third count latched in the second logic circuit.

5. An apparatus comprising:
   a plurality of memory banks, wherein each memory bank of the plurality of memory banks is associated with a latch configured to store a row address for row hammer refresh; and
   a time based sampling circuit including:
      a sampling timing generator configured to provide a timing signal of sampling a row address;
      a plurality of bank sampling circuits, wherein each bank sampling circuit of the plurality of bank sampling circuits is associated with a corresponding memory bank of the plurality of memory banks, wherein each bank sampling circuit is configured to provide a sampling signal to the latch of the corresponding memory bank responsive to the timing signal of sampling the row address; and
      an interval measurement circuit configured to receive an oscillation signal, configured to measure an interval of a row hammer refresh execution based on a cycle of the oscillation signal, and further configured to provide a steal rate timing signal for adjusting a steal rate to the sampling timing generator,
      wherein the sampling timing generator is further configured to provide the timing signal of sampling the row address, responsive, at least in part, to the steal rate timing signal, and
      wherein the latch of the corresponding memory bank is configured to store the row address, responsive, at least in part, to the timing signal of sampling the row address.

6. The apparatus of claim 5, wherein the interval measurement circuit comprises:
   an interval counter configured to provide an interval count of an interval of a row hammer refresh execution responsive, at least in part, to a row hammer refresh (RHR) execution signal and the oscillation signal; and
   an interval latch configured to provide the interval count to the sampling timing generator responsive to a match signal from the sampling timing generator.

7. The apparatus of claim 6, wherein the interval counter includes:
   a plurality of flip-flop circuits coupled in cascade connection and configured to latch the oscillation signal responsive to the row hammer refresh (RHR) execution signal; and
   a plurality of counter latches configured to latch output signals of the plurality of corresponding flip-flop circuits responsive, at least in part, to the row hammer refresh (RHR) execution signal and the match signal.

8. The apparatus of claim 6, wherein the sampling timing generator comprises:
   a first counter configured to count to the count of the interval of row hammer refresh execution from the latch circuit responsive, at least in part, to the oscillation signal and the row hammer refresh (RHR) execution signal and further configured to provide a first count; and
   a second counter configured to count from a first row hammer execution to a second row hammer execution immediately after the first row hammer execution responsive, in part, to the oscillation signal and the row hammer refresh (RHR) execution signal and further configured to provide a second count;
a first comparator configured to provide the match signal in an active state if the first count and the second count matches;
a second comparator configured to provide a reset signal in an active state if the first count and the interval count matches; and
a sampling unit configured to provide the timing signal of sampling the row address,
wherein the sampling unit is configured to reset responsive to the reset signal and further configured to receive the oscillation signal if the match signal is in an inactive state.

9. The apparatus of claim 8, wherein the first counter is configured to reset responsive to the reset signal, and
wherein the second counter is configured to count responsive to the oscillation signal if the match signal is in the inactive state.

10. The apparatus of claim 8, wherein the first counter is configured to receive an active command while the match signal is in the inactive state.

11. The apparatus of claim 8, wherein the first comparator and the second comparator exclusive OR circuits.

12. The apparatus of claim 8, wherein the sampling unit includes:
an oscillation pulse circuit configured to provide an oscillation pulse signal responsive to the oscillation signal if the match signal is in the inactive state;
a reset divider circuit configured to provide a divided reset signal responsive to the reset signal;
a row hammer refresh (RHR) pulse circuit configured to provide an RHR pulse signal responsive to the row hammer refresh (RHR) execution signal if the match signal is in the inactive state; and
a latch circuit configured to provide the timing signal of sampling the row address responsive to the oscillation pulse signal, the RHR pulse signal and the divided reset signal.

13. The apparatus of claim 5, wherein each bank sampling circuit of the plurality of bank sampling circuits includes a latch circuit and a NAND circuit,
wherein the latch circuit is configured to provide an enable signal responsive to the timing signal of sampling a row address and a positive power potential; and
wherein the NAND circuit is configured to a command based pulse signal responsive to the enable signal.

14. An apparatus comprising:
a command based sampling circuit configured to provide a command based sampling signal responsive to a command based pulse signal;
a time based sampling circuit configured to provide a time based sampling signal responsive to the command based pulse signal and a time based pulse signal; and
a mixer circuit configured to provide either the time based sampling signal or the command based sampling signal responsive to a switch signal,
wherein the time based pulse signal is based on a steal rate timing signal for adjusting a steal rate.

15. The apparatus of claim 14, further comprising:
a sampling timing generator configured to provide the time based pulse signal; and
an interval measurement circuit configured to receive an oscillation signal, configured to measure an interval of a row hammer refresh execution based on a cycle of the oscillation signal, and further configured to provide the steal rate timing signal responsive, at least in part, to the measured interval of the row hammer refresh execution.

16. The apparatus of claim 14, further comprising a command based probability adjustment circuit configured to reduce probability of active states in the time based sampling signal based on the command based pulse signal with randomization and further configured to provide an adjusted time based sampling signal as the time based sampling signal to the mixer circuit.

17. The apparatus of claim 16, further comprising a time based probability adjustment circuit configured to reduce probability of active states in the command based sampling signal based on the time based pulse signal and further configured to provide an adjusted command based sampling signal as the command based sampling signal to the mixer circuit.

18. The apparatus of claim 16, wherein the command based probability adjustment circuit includes a pseudo random number generator configured to randomize the command based pulse signal.

19. The apparatus of claim 18, wherein the pseudo random number generator comprises a linear feedback shift register (LFSR) computation circuit.

20. The apparatus of claim 15, further comprising:
a random number generator configured to provide a randomized number based on the command based pulse signal and a row hammer refresh execution signal; and
a random period clock generator configured to adjust a cycle of the oscillation signal with randomization and further configured to provide an adjusted oscillation signal,
wherein the command based sampling circuit includes:
a random sampler configured to randomize the command based pulse signal with a randomized number and further configured to provide an intermediate sampling signal; and
a shift register configured to store a current row address and preceding row addresses responsive to the first sampling signal and to compare the current row address and the preceding row addresses, the shift register further configured to provide a match signal if at least one row address of the preceding row addresses matches with the current row address and to provide a time based sampling signal,
wherein the time based sampling circuit comprises a time based random sampler configured to receive the oscillation signal, the adjusted oscillation signal and the row hammer refresh execution signal and further configured to provide the time based sampling signal, and
wherein the random period clock generator is configured to adjust the cycle of the oscillation signal with randomization based on the randomized number.

* * * * *